(12) United States Patent
Lu et al.

(10) Patent No.: US 8,299,483 B2
(45) Date of Patent: Oct. 30, 2012

(54) LIGHT-EMITTING SEMICONDUCTOR APPARATUS

(75) Inventors: Chih-Chiang Lu, Hsinchu (TW);
Wei-Chih Peng, Hsinchu (TW);
Chien-Yuan Wang, Hsinchu (TW);
Wei-Yo Chen, Hsinchu (TW);
Shiau-Huei San, Hsinchu (TW);
Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 181 days.

(21) Appl. No.: 12/652,373

(22) Filed: Jan. 5, 2010

(65) Prior Publication Data

US 2010/0171094 A1    Jul. 8, 2010

(30) Foreign Application Priority Data

Jan. 5, 2009   (TW) .............................. 98100024 A

(51) Int. Cl.
*H01L 33/00* (2010.01)
(52) U.S. Cl. ............ 257/98; 257/E33.072; 257/E33.064
(58) Field of Classification Search .................. 257/13, 257/98, E33.068, E33.067, E33.064, E33.069, 257/81, 99, 100, 103, E33.072
See application file for complete search history.

(56) References Cited

U.S. PATENT DOCUMENTS

| 6,563,141 | B1 * | 5/2003 | Dawson et al. ................. 257/98 |
| 6,696,703 | B2 * | 2/2004 | Mueller-Mach et al. ....... 257/98 |
| 2002/0030444 | A1 | 3/2002 | Muller-Mach |
| 2003/0164503 | A1 * | 9/2003 | Chen ................. 257/79 |
| 2004/0178415 | A1 * | 9/2004 | Hsu et al. ........................ 257/80 |
| 2006/0001032 | A1 * | 1/2006 | Murofushi et al. ............. 257/79 |
| 2006/0186418 | A1 * | 8/2006 | Edmond et al. ................. 257/79 |
| 2007/0001183 | A1 * | 1/2007 | Chen ............................... 257/98 |
| 2008/0157109 | A1 * | 7/2008 | Hon ............................... 257/98 |
| 2008/0190479 | A1 * | 8/2008 | Hsieh et al. .................... 136/246 |
| 2009/0084439 | A1 * | 4/2009 | Lu et al. ......................... 136/256 |
| 2010/0019268 | A1 * | 1/2010 | Illek ............................... 257/99 |
| 2010/0098127 | A1 * | 4/2010 | Higuchi et al. ............ 372/50.11 |
| 2010/0283081 | A1 * | 11/2010 | Huang et al. .................... 257/99 |

FOREIGN PATENT DOCUMENTS

| TW | 513819 | 12/2002 |
| TW | 577178 | 2/2004 |

* cited by examiner

*Primary Examiner* — Matthew Landau
*Assistant Examiner* — Latanya N Crawford
(74) *Attorney, Agent, or Firm* — Muncy, Geissler, Olds & Lowe, PLLC

(57) ABSTRACT

A light-emitting semiconductor apparatus includes a light-emitting structure, a reflective structure, and a carrier. The light-emitting structure includes a first type semiconductor layer, a second type semiconductor layer, and a light-emitting layer positioned between the first type semiconductor layer and the second type semiconductor layer. The reflective structure has a first transparent conductive layer, a first patterned reflective layer, a second transparent conductive layer, and a second patterned reflective layer. The first patterned reflective layer is disposed between the first transparent conductive layer and the second transparent conductive layer, and has an opening for physically connecting the first transparent conductive layer and the second transparent conductive layer. The second transparent conductive layer is disposed between the first patterned reflective layer and the second patterned reflective layer. The second patterned reflective layer is positioned on an area corresponding to the opening. The light-emitting structure and the carrier are respectively on two sides of the reflective structure.

18 Claims, 9 Drawing Sheets

LIGHT-EMITTING SEMICONDUCTOR APPARATUS

TECHNICAL FIELD

The application is related to a light-emitting device or apparatus, especially to a light-emitting semiconductor device or apparatus.

REFERENCE TO RELATED APPLICATION

This application claims the right of priority based on Taiwan application Ser. No. 098100024, filed Jan. 5, 2009, and the content of which is hereby incorporated by reference.

DESCRIPTION OF BACKGROUND ART

FIG. 1 illustrates a structure of a conventional light-emitting diode (LED). Referring to FIG. 1, a light-emitting diode 100 includes an n-type semiconductor layer 110, a light-emitting layer 120, a p-type semiconductor layer, reflective layers 140, and electrodes 150. The light-emitting layer 120 is arranged on a partial area of the n-type semiconductor layer 110. The p-type semiconductor layer 130 is positioned on the light-emitting layer 120. The n-type semiconductor layer 110 can be a multi-layer n-type semiconductor structure. The p-type semiconductor 130 can be also a multi-layer p-type semiconductor structure. The reflective layer 140 is arranged within the n-type semiconductor layer 110, as shown in FIG. 1. In addition, the electrodes 150 are configured on a surface 110a of the n-type semiconductor layer 110 and a surface 130a of the p-type semiconductor layer 130 for electrically connecting to the n-type semiconductor layer 110 and the p-type semiconductor layer 130, respectively.

The light-emitting diode 110 is known to be a horizontal-type light-emitting diode with a stack layer structure. The reflective layers 140 are disposed within the n-type semiconductor 110 of the light-emitting diode 100. Provided the light-emitting diode 100 is driven to emit light, the reflective layer 140 within the n-type semiconductor layer 110 is, therefore, capable of reflecting the light produced internally. Accordingly, the light-emitting efficiency of the light-emitting diode 100 is elevated.

SUMMARY OF THE DISCLOSURE

A light-emitting semiconductor apparatus is disclosed to include a light-emitting structure, a reflective structure, and a carrier. The light-emitting structure at least includes a first-type semiconductor layer, a second-type semiconductor layer, and a light-emitting layer disposed between the first-type semiconductor layer and the second-type semiconductor layer. The reflective structure has a first transparent conductive layer, a first patterned reflective layer, a second transparent conductive layer, and a second patterned reflective layer. The first patterned reflective layer is disposed between the first transparent conductive layer and the second transparent conductive layer, and has at least one opening for physically connecting the first transparent conductive layer and the second transparent conductive layer. The second transparent conductive layer is disposed between the first patterned reflective layer and the second patterned reflective layer. The second patterned reflective layer is positioned on an area substantially corresponding to the opening. The light-emitting structure and the carrier are positioned on two sides of the reflective structure respectively.

In one embodiment, the first patterned reflective layer includes a metal layer and at least one insulating layer. The insulating layer is arranged between the metal layer and the first transparent conductive layer, the metal layer and the second transparent conductive layer, or both thereof.

In one embodiment, the second patterned reflective layer includes a metal layer and at least one insulating layer. The insulating layer is arranged between the metal layer and the second transparent conductive layer, the metal layer and the carrier, or both thereof.

In one embodiment, at least one of the first patterned reflective layer and the second patterned reflective layer includes a distributed Bragg reflector (DBR).

In one embodiment, at least one of the first patterned reflective layer and the second patterned reflective layer has a pattern selected from the group consisting of a circle, an ellipse, a polygon, and any combination thereof.

In one embodiment, at lest one of the first-type semiconductor layer and the second-type semiconductor layer includes a material selected from the group consisting of nitrogen, gallium, indium, aluminum, phosphorus, arsenic, and zinc.

In one embodiment, the light-emitting structure includes a multi-quantum well (MQW) structure, single heterostructure (SH), double heterostructure (DH), double-side double heterostructure (DDH), or any combination thereof.

In one embodiment, the light-emitting semiconductor apparatus further includes a wavelength conversion layer positioned on the light-emitting structure.

In one embodiment, the light-emitting semiconductor apparatus further includes a connecting layer, positioned between the light-emitting structure and carrier, for connecting the reflective structure and the carrier.

In one embodiment, the light-emitting structure has at least one light-exiting surface on which a textured pattern is formed.

In one embodiment, the textured pattern includes a pattern selected from the group consisting of a regular pattern, an irregular pattern, and a photonic crystal structure.

In one embodiment, the carrier is formed by at least one material of metal, non-metal, silicon, and plating copper.

In one embodiment, at least one of the first transparent conductive layer and the second transparent conductive layer includes indium tin oxide, indium zinc oxide, indium tin zinc oxide, hafnium oxide, zinc oxide, aluminium oxide, aluminium tin oxide, aluminium zinc oxide, cadmium tin oxide, cadmium zinc oxide, or any combination thereof.

In one embodiment, the light-emitting semiconductor apparatus further includes a current spreading layer on the light-emitting structure.

In one embodiment, the light-emitting semiconductor apparatus further includes an electrode on the light-emitting structure.

A light-emitting semiconductor apparatus is also disclosed to include a light-emitting structure, a transparent non-semiconductor layer, a first reflective layer, and a second reflective layer. The light-emitting structure includes a first-type semiconductor layer, a second-type semiconductor layer, and a light-emitting layer disposed between the first-type semiconductor layer and the second-type semiconductor layer. The transparent non-semiconductor layer is electrically connected to the light-emitting structure and the carrier. The transparent non-semiconductor layer has a structure like that of the first transparent conductive layer and the second transparent conductive layer as described above. The first reflective layer has a first surface near the light-emitting structure and a second surface distant from the light-emitting structure.

The second reflective layer has a third surface near the light-emitting structure and a forth surface distant from the light-emitting structure. The first reflective layer and the second reflective layer are positioned between the light-emitting structure and carrier, and the first surface and the third surface are not on the same horizontal plane.

In one embodiment, the second surface and the forth surface are not on the same horizontal plane.

In one embodiment, the transparent non-semiconductor layer surrounds at least one of the first reflective layer and the second reflective layer.

In one embodiment, at least one of the first reflective layer and the second reflective layer has a metal layer and an insulating layer.

In one embodiment, at least one of the first reflective layer and the second reflective layer includes a metal layer and a distributed Bragg reflector (DBR).

In one embodiment, at least one of the first reflective layer and the second reflective layer has a textured structure.

As described above, the reflective structure of the light-emitting semiconductor apparatus has a first transparent conductive layer and a second transparent conductive layer, and therefore can function as a conductive connecting layer. Moreover, the first reflective layer and the second reflective layer of the reflective structure can function as an optical reflective structure of the light-emitting semiconductor apparatus.

DETAILED DESCRIPTION OF PREFERRED EMBODIMENTS

Figure 1:
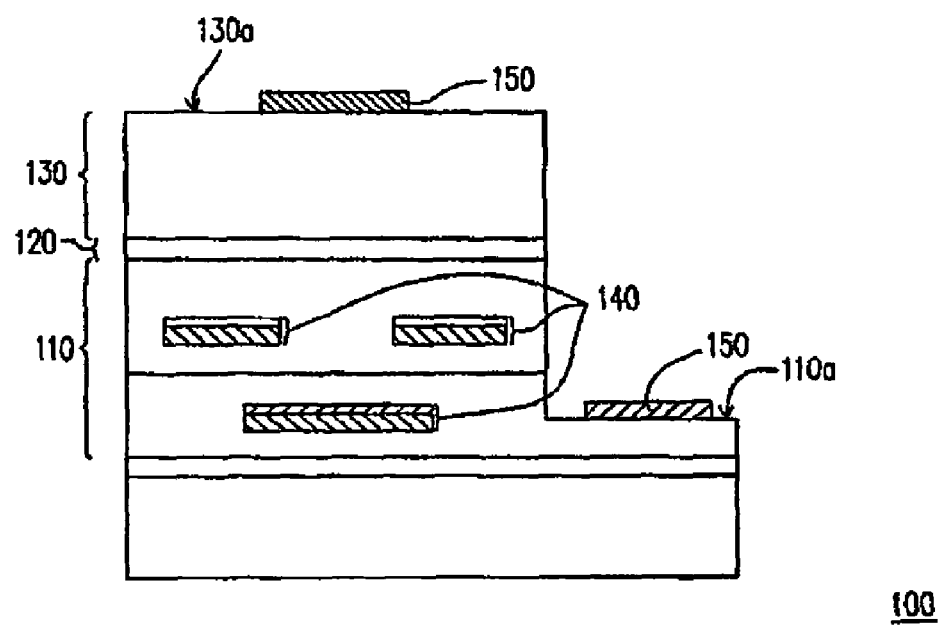
FIG. 1 illustrates a structure of a conventional light-emitting diode.
Figure 2:
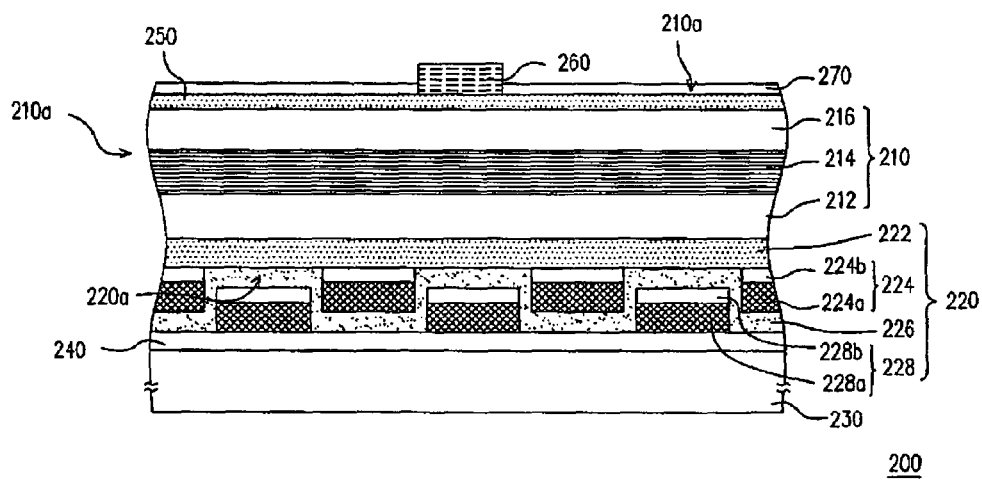
FIG. 2 illustrates a structure of a light-emitting semiconductor apparatus according to an embodiment of present invention.

FIG. 2 illustrates a structure of a light-emitting semiconductor apparatus according to an embodiment of present invention. The light-emitting semiconductor apparatus 200 includes a light-emitting structure 210, a reflective structure 220, and a carrier 230. The light-emitting structure 210 has at least a first-type semiconductor layer 212, a second-type semiconductor layer 216, and a light-emitting layer 214 positioned between the first-type semiconductor layer 212 and the second-type semiconductor layer 216. The reflective structure 220 has a first transparent conductive layer 222, a first patterned reflective layer 224, a second transparent conductive layer 226, and a second patterned reflective layer 228. The first patterned reflective layer 224 is positioned between the first transparent conductive layer 222 and the second transparent conductive layer 226, and has at least one opening 220a to physically connect the first transparent conductive layer 222 and the second transparent conductive layer 226. The second transparent conductive layer 226 is positioned between the first transparent conductive layer 222 and the carrier 230.

In one embodiment, the second transparent conductive layer 226 is formed between the first patterned reflective layer 224 and the second patterned reflective layer 228. The second patterned reflective layer 228 is arranged on an area substantially corresponding to the opening 220a, and has a size greater than, equal to, or smaller than that of the opening 220a. In addition, a part of the second patterned reflective layer 228 is formed within the opening 220a, as shown in the drawing. However, the whole body of the second patterned reflective layer 228 can be also formed beyond the opening 220a. The light-emitting structure 210 and the carrier 230 are respectively positioned on two sides of the reflective structure 220. Moreover, the light-emitting semiconductor apparatus 200 further includes an electrode 260 positioned above the light-emitting structure 210.

In present embodiment, the materials of the first-type semiconductor layer 212 and the second-type semiconductor layer 216 include at least one element of N, Ga, In, Al, P, As, and Zn, and doped with II or IV group element. For example, the first-type semiconductor layer 212 and the second-type semiconductor layer 216 are selected from at least one material of GaN, AlGaN, InGaN, and AlInGaN, and doped with II or IV group element. However, the embodiment of the present invention is only illustrated with, but not limited to, the above description. In other words, layer 212, 216 can be selected from other suitable material. In addition, light-emitting layer 214 is formed in a structure such as multi-quantum well (MQW) structure, single heterostructure (SH), double heterostructure (DH), double-side double heterostructure (DDH), a combination thereof, and other suitable structure. The embodiment of the present invention is only illustrated with, but not limited to, the above deception.

In present embodiment, the first patterned reflective layer 224 includes a metal layer 224a and at least one insulating layer 224b. The insulating layer 224b can be formed between the metal layer 224a and the first transparent conductive layer 222, the metal layer 224a and the second transparent conductive layer 226, the metal layer 224a and the carrier 230, or any combination thereof. In other words, the insulating layer 224b can be formed on one or more surfaces of the metal layer 224a. As shown in FIG. 2, the insulating layer 224b is positioned between the metal layer 224a and the first transparent conductive layer 222.

Furthermore, the metal layer 224a is made by a reflective metal such as Au, Ag, Cu, Fe, Sn, Cr, Al, Ni, or an alloy thereof, a stack layer thereof, and a combination thereof. In addition, the insulating layer 224b is formed by inorganic material (such as silicon oxide ($SiO_x$), nitride oxide ($SiN_x$), silicon oxynitride ($Si_xNO_y$), silicon carbide ($SiC_x$), hafnium oxide ($HfO_2$), alumina ($Al_2O_3$), other suitable material, and a combination thereof), organic material (such as photoresist (PR), benzocyclobutane (BCB), cycloolefin, polyimide, polyamide, polyester, polyalcohols, polyethylene, polyphenylene, resin, polyether, polyketone, other suitable material, and a combination thereof), or a combination thereof. In present embodiment, the insulating layer 224b is illustrated with, but not limited to, AlN.

In present embodiment, the second patterned reflective layer 228 includes a metal layer 228a and at least one insulating layer 228b. The insulating layer 228b is formed between the metal layer 228a and the second transparent conductive layer 226, the metal layer 228a and carrier 230, or a combination thereof. In other words, the insulating layer 228b can be formed on one or more surfaces of the metal layer 228a. In FIG. 2, the insulating layer 228b is positioned between the metal layer 228a and the second transparent conductive layer 226, and near the first transparent conductive layer 222. However, in another embodiment, the insulating layer 228b can be positioned on other directional surface of the metal layer 228a. FIG. 2 is only an illustration, but not a limitation, of an embodiment of the present invention. Moreover, the metal layer 228a and the insulating layer 228b can be formed by a material as described of the metal layer 224a, or the insulating layer 224b.

In another embodiment, other than the above-mentioned configurations, the first patterned reflective layer 224 and the second patterned reflective layer 228 can also include a distributed Bragg reflector (DBR) reflectively. In further embodiment, the insulating layer 224b of the first patterned reflective layer 224 and the insulating layer 228b of the second patterned reflective layer 228 can be respectively formed as a DBR by insulating material to reflect the internal light generated during the operation of the light-emitting semiconductor apparatus. The light, therefore, can be effectively reflected to leave an outer surface of the light-emitting semiconductor 200, and the light extraction efficiency can be further elevated.

Figure 3A:
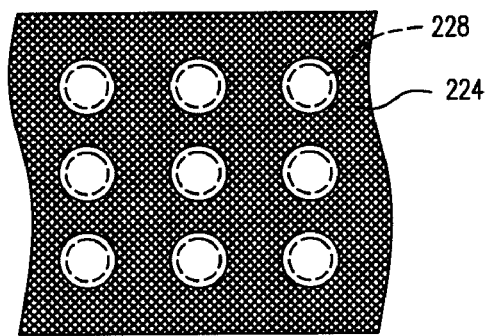
FIG. 3A shows a top view of a first patterned reflective layer of a light-emitting semiconductor apparatus.
Figure 3B:
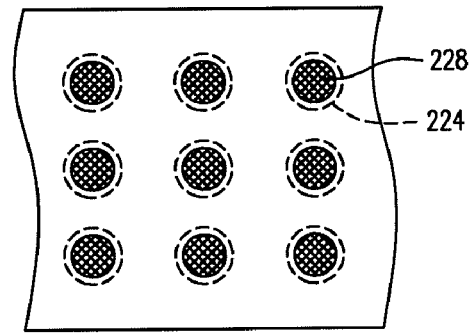
FIG. 3B shows a top view of a second patterned reflective layer of a light-emitting semiconductor apparatus.

In addition, the patterns of the above-mentioned first patterned reflective layer 224 and second patterned reflective layer 228 can be selected from at least one of a circle, an ellipse, a polygon, and other geometrical pattern. In present embodiment, the pattern includes circles. FIG. 3A and FIG. 3B are top cross sectional views of the light-emitting semiconductor apparatus of FIG. 2. FIG. 3A is the top cross sectional view of the first patterned reflective layer of the light-emitting semiconductor apparatus. FIG. 3B is the top cross sectional view of the second patterned reflective layer of the light-emitting semiconductor apparatus. Nevertheless, in other embodiment, the patterns of the first patterned reflective layer 224 and the second patterned reflective layer 228 are not limited to the illustrations of FIG. 3A and FIG. 3B but designed to meet the requirements of users.

In order to improve the light extraction efficiency of the light-emitting semiconductor apparatus, at least one light-emitting surface 210a of the light-emitting structure 210 has textured patterns (not shown). In detail, the textured pattern is a regular pattern, an irregular pattern, a photonic crystal, or other suitable pattern. In the case, the light inside the light-emitting semiconductor apparatus 200 can leave out the light-emitting structure 210 more easily by the textured pattern and the light-extraction efficiency of the light-emitting semiconductor apparatus 200 can be further improved. In one embodiment, the textured pattern can be formed on at least one surface of the first-type semiconductor layer 212, light-emitting layer 214, and the second-type semiconductor layer 216. In another embodiment, the textured pattern can be also formed on other layer (an example is a current spreading layer as described below). In other words, the textured pattern is not limited to above illustrations but configured to meet the requirements of users.

In present embodiment, the carrier 230 can be formed by metallic material, non-metallic material, or a combination thereof. The non-metallic material is such as Si, SiC, AlN, ZnO, GaN, GaP, glass, ceramic, composite material, sapphire, and plastic. The metallic material is such as a metal bulk, a plating metal, an alloy, and a stack. The combination of the metallic material and non-metallic material is like metal matrix composite material. Provided the material of the carrier 230 is a non-electric conductor, an electric conducting channel, such as a via and an extending line, can be introduced to the interior, the exterior, or both, so that current can flow through the non-electric conductor. The present embodiment is exemplified, but not limited to, with Si. In other embodiment, the carrier 230 is formed by plating cooper which can substitute a connecting layer 240 (as described below). In another embodiment, the carrier 230 includes a circuit or an electrical component, such as a package base, a printed circuit board, a flexible circuit board, and an integrated circuit. Moreover, the carrier 230 can be integrated with the light-emitting structure 210 in any suitable step of manufacturing the light-emitting semiconductor or a downstream product. Even so, the carrier 230 is not limited to the above descriptions but configured to meet the requirements of users.

In present embodiment, the respective materials of the first transparent conductive layer 222 and the second transparent conductive layer 226 are indium tin oxide (ITO), indium zinc oxide (IZO), indium tin zinc oxide (ITZO), hafnium oxide ($HfO_2$), ZnO, aluminum tin oxide (ATO), aluminum zinc oxide (AZO), cadmium tin oxide (CTO), or cadmium zinc oxide (CZO). The present invention is illustrated with, but not limited to, ITO In addition, the light-emitting semiconductor apparatus 200 also includes a current spreading layer 250 positioned on the light-emitting structure 210, as shown in FIG. 2. In general, the current spreading layer 250 is used to spread current injected into the light-emitting structure 210. The materials of the current spreading layer 250 can be referred to those of the first transparent conductive layer 222, as described above.

In present embodiment, the light-emitting apparatus 200 can further include a wavelength conversion layer 270. The wavelength conversion layer 270 is arranged on the light-emitting structure 210 to change the wavelength of light from the light-emitting structure 210. For example, a shorter wavelength is converted to a longer wavelength, or a longer wavelength is converted to a shorter wavelength. The wavelength conversion layer 270 is such as a fluorescent material capable of excited by the light from the light-emitting structure 210. In other words, by properly adjusting or selecting the material of the wavelength conversion layer, the light-emitting semiconductor apparatus 200 can emit variant lights, such as red light, blue light, green light, white light, and other visible or invisible light.

In present embodiment, the light-emitting semiconductor apparatus 200 further includes a connecting layer 240. The connecting layer 240 is positioned between the reflective structure 220 and the carrier 230, as shown in FIG. 2. In detail, the connecting layer 240 is used to join the reflective structure 220 and the carrier 230. According to the joining requirement, the material of the connecting layer 240 can be oxide, nitride, or metal. In addition, the reflective structure 220 and the carrier 230 can also be directly joined under proper temperature and pressure without other material intervened.

Figure 4:
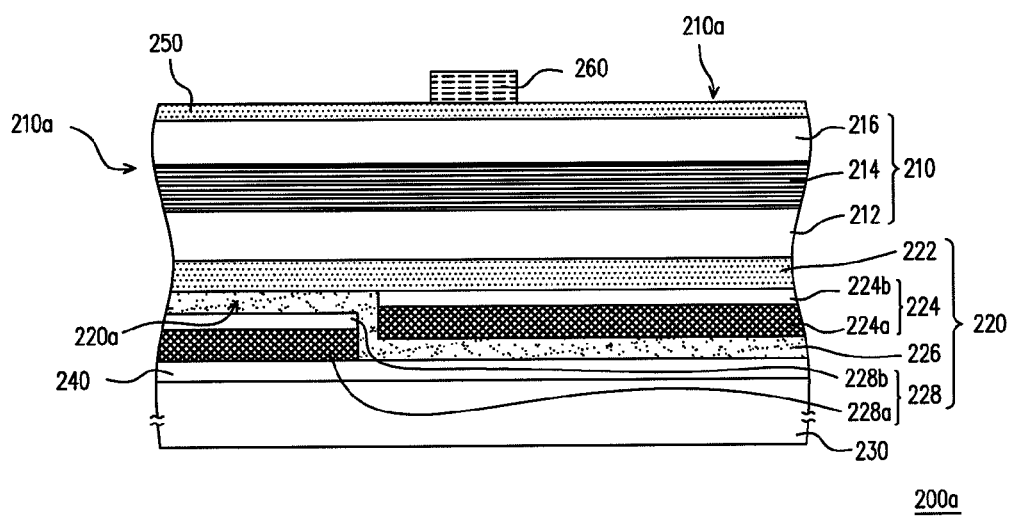
FIG. 4 shows a cross sectional view of a light-emitting semiconductor apparatus according to another embodiment of present invention.
Figure 5A:
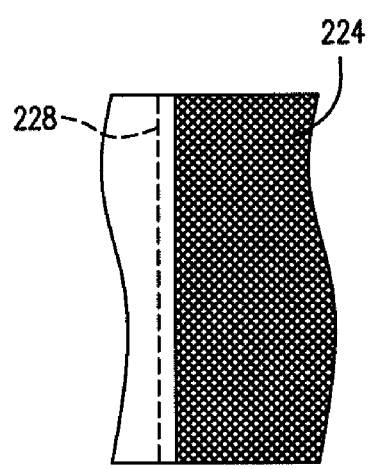
FIG. 5A and FIG. 5B show top views of the first patterned reflective layer and the second patterned reflective layer of FIG. 4.
Figure 5B:
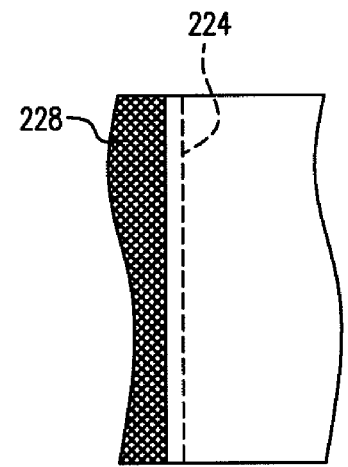

In one embodiment, as shown in FIG. 4, the light-emitting semiconductor apparatus 200a has an arrangement of the first patterned reflective layer 224 and the second patterned reflective layer 228. Comparing FIG. 2 with FIG. 4, the light-emitting semiconductor apparatus 200a and 200 have similar structures, and the same notations are given to the similar elements. However, a difference between the two figures is the pattern between the first patterned reflective layer 224 and the second patterned reflective layer 228. For example, the arrangements of the first patterned reflective layer 224 and the second patterned reflective layer 228 within the light-emitting semiconductor apparatus 200a are respectively shown in the cross sectional views of FIGS. 5A and 5B. The first patterned reflective layer 224 can be formed in a circle or other patterns described above. The second patterned reflective layer 228 has a pattern substantially corresponding to that of the first patterned reflective layer 224. From top view, a gap (not shown) exists, but not limited to, between the first patterned reflective layer 224 and the second patterned reflective layer 228. Furthermore, FIGS. 5A and 5B merely show possible patterns of the first patterned reflective layer 224 and the second patterned reflective layer 228. Users may adopt other pattern designs of other embodiments according to their requirements.

Figure 6A:
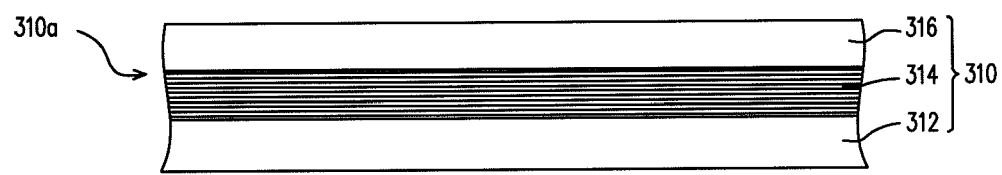
FIG. 6A~FIG. 6D illustrate flow charts of manufacturing a light-emitting semiconductor apparatus according to an embodiment of present invention.

In addition, FIGS. 6A~6D show flow charts of manufacturing a light-emitting semiconductor apparatus according to an embodiment of present invention. Referring to FIG. 6A, a light-emitting structure 310 is provided firstly. The light-emitting structure 310 at least has a first-type semiconductor layer 312, a second-type semiconductor layer 316, and a light-emitting layer 314 between the first-type semiconductor layer 312 and the second-type semiconductor layer 316. In detail, a method of forming the light-emitting structure 310 is like the high temperature epitaxial technology. The first-type semiconductor layer 312, the second-type semiconductor layer 316, and the light-emitting layer 314 are sequentially formed on a growth substrate (not shown). The materials of the first-type semiconductor layer 312, the second-type semiconductor layer 316, and the light-emitting layer 314 are as described above. The whole or portion of the growth substrate can be removed before or after the following manufacturing step(s).

Figure 6B:
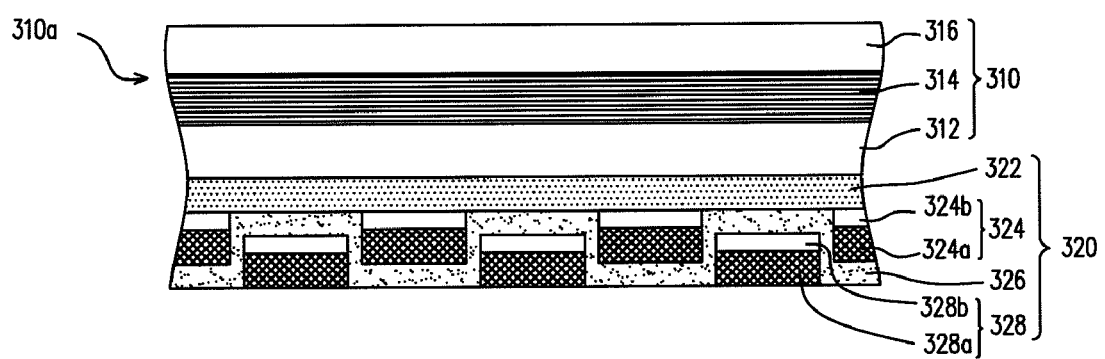

Referring to FIG. 6B, a reflective structure 320 is then formed on a surface of the first-type semiconductor layer 312 or the second-type semiconductor layer 316. The reflective structure 320 has a first transparent conductive layer 322, a first patterned reflective layer 324, a second transparent conductive layer 326, and a second patterned reflective layer 328. In detail, the first transparent conductive layer 322 structure is formed by overlaying a transparent conductive material on an entire surface of the first-type semiconductor layer 312 or the second-type semiconductor layer 316. Afterward a first patterned reflective layer 324 is formed on the first transparent conductive layer 322. The method of forming the first patterned reflective layer 324 is like the photolithography and etching process (PEP). The second transparent conductive layer 326 is then formed by overlaying another transparent conductive material on an entire surface of the first patterned reflective layer 324, and a second patterned reflective layer 328 is formed on the second transparent conductive layer 326. The method of forming the second patterned reflective layer 328 is similar to that of forming the first patterned reflective layer 324.

Figure 6C:
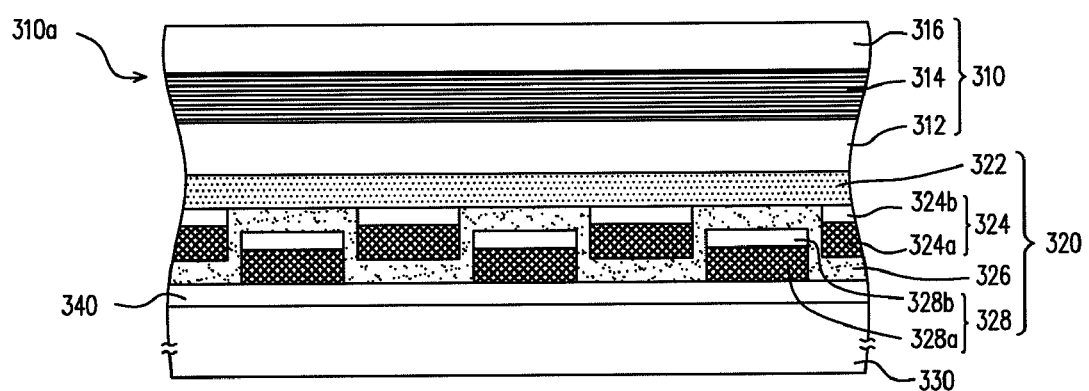

After completing above processes, a carrier 330 is then connected to the above-mentioned reflective structure 320. The carrier 330 and the light-emitting structure 310 are positioned on two sides of the reflective structure 320, as shown in FIG. 6C. In the foregoing, the carrier 330 and the reflective structure 320 can be connected by glue bonding or metal bonding. A connecting layer 340 is used as a metal bonding layer in present embodiment, but not limited hereto.

Figure 6D:
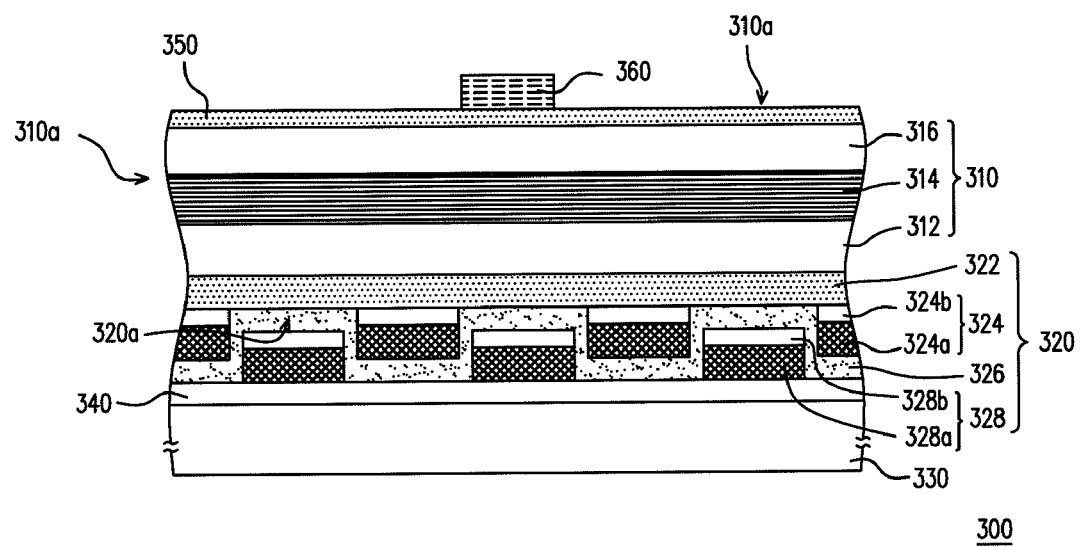

Moreover, an electrode 360 is formed on the light-emitting structure 310, as shown in 6D. In addition, in order to elevate the light-emitting efficiency of the light-emitting semiconductor, a current spreading layer 350 can be formed on the light-emitting structure 310 before forming the electrode 360, as shown in FIG. 6D.

The foregoing description has been directed to the specific embodiments of this invention. It will be apparent; however, that other alternatives and modifications may be made to the embodiments without escaping the spirit and scope of the invention.

What is claimed is:

1. A tight-emitting semiconductor apparatus comprising:
    a light-emitting structure comprising a first type semiconductor layer, a second type semiconductor layer, and a light-emitting layer between the first type semiconductor layer and the second type semiconductor layer;
    a reflective structure comprising a first transparent conductive layer, a first patterned reflective layer, a second transparent conductive layer, and a second patterned reflective layer; and
    a carrier;
    wherein the first patterned reflective layer is disposed between the first transparent conductive layer and the second transparent conductive layer, and comprises at least one opening for physically connecting the first transparent conductive layer and the second transparent conductive layer;
    wherein the second transparent conductive layer is disposed between the first patterned reflective layer and the second patterned reflective layer, and the second patterned reflective layer is substantially on an area corresponding to the opening; and wherein the light-emitting structure and the carrier are respectively on two sides of the reflective structure, and
    wherein the first patterned reflective layer comprises a metal layer and an insulating layer, and the insulating layer is arranged between the metal layer and the first transparent conductive layer the metal layer and the second transparent conductive layer or both.

2. The light-emitting semiconductor apparatus of claim 1, wherein the second patterned reflective layer comprises a metal layer and an insulating layer, and the insulating layer is arranged between the metal layer and the second transparent conductive layer, the metal layer and the carrier, or both.

3. The light-emitting semiconductor apparatus of claim 1, wherein at least one of the first patterned reflective layer and the second patterned reflective layer comprises a distributed Bragg reflector (DBR).

4. The light-emitting semiconductor apparatus of claim 1, wherein at least one of the first patterned reflective layer and the second patterned reflective layer forming a pattern selected from the group consisting of circle, ellipse, polygon, and any combination thereof.

5. The light-emitting semiconductor apparatus of claim 1, wherein at lest one of the first type semiconductor layer and the second type semiconductor layer comprises a material selected from the group consisting of nitrogen, gallium, indium, aluminum, phosphorus, arsenic, and zinc.

6. The light-emitting semiconductor apparatus of claim 1, wherein the light-emitting structure comprises a multi-quantum well(MQW) structure, single heterostructure(SH), double heterostructure(DH), double-side double heterostructure(DDH), or any combination thereof.

7. The light-emitting semiconductor apparatus of claim 1, further comprising a wavelength conversion layer on the light-emitting layer.

8. The light-emitting semiconductor apparatus of claim 1, further comprising a connecting layer, positioned between the light-emitting structure and carrier, for connecting the reflective structure and the carrier.

9. The light-emitting semiconductor apparatus of claim 1, wherein the light-emitting structure has at least one light-exiting surface on which a textured pattern is formed.

10. The light-emitting semiconductor apparatus of claim 1, wherein the carrier comprises at least one of metal, non-metal, silicon, and plating copper.

11. The light-emitting semiconductor apparatus of claim 1, wherein at least one of the first transparent conductive layer and the second transparent conductive layer comprises indium tin oxide, indium zinc oxide, indium tin zinc oxide, hafnium oxide, zinc oxide, aluminium oxide, aluminium tin oxide, aluminium zinc oxide, cadmium tin oxide, cadmium zinc oxide, or any combination thereof.

12. The light-emitting semiconductor apparatus of claim 1, further comprising a current spreading layer on the light-emitting structure.

13. The light-emitting semiconductor apparatus of claim 1, further comprising an electrode on the light-emitting structure.

14. The light-emitting semiconductor apparatus of claim 9, wherein the textured pattern comprises a pattern selected from the group consisting of a regular pattern, an irregular pattern, and a photonic crystal structure.

15. A light-emitting semiconductor apparatus comprising:
   a light-emitting structure comprising a first type semiconductor layer, a second type semiconductor layer, and a light-emitting layer between the first type semiconductor layer and the second type semiconductor layer;
   a carrier;
   a transparent non-semiconductor layer electrically connected to the light-emitting structure and the carrier;
   a first patterned reflective layer having a first surface near the light-emitting structure and a second surface distant from the light-emitting structure; and
   a second patterned reflective layer having a third surface near the light-emitting structure and a forth surface distant from the light-emitting structure;
   Wherein the first patterned reflective layer and the second patterned reflective layer are positioned between the light-emitting structure and carrier, and the first surface and the third surface are not on the same horizontal plan;
   wherein at least one of the first patterned reflective layer and the second patterned reflective layer comprises a metal layer and an insulating layer.

16. The light-emitting semiconductor apparatus of claim 15, wherein the second surface and the forth surface are not on the same horizontal plane.

17. The light-emitting semiconductor apparatus of claim 15, wherein the transparent non-semiconductor layer surrounds at least one of the first patterned reflective layer and the second patterned reflective layer.

18. The light-emitting semiconductor apparatus of claim 15, wherein at least one of the first patterned reflective layer and the second patterned reflective layer comprises a metal layer and a distributed Bragg reflector (DBR).

* * * * *